US006716479B2

(12) United States Patent
Lu et al.

(10) Patent No.: US 6,716,479 B2
(45) Date of Patent: Apr. 6, 2004

(54) TAILORING PIEZOELECTRIC PROPERTIES USING MGXZN1-XO/ZNO MATERIAL AND MGXZN1-XO/ZNO STRUCTURES

(75) Inventors: Yicheng Lu, East Brunswick, NJ (US); Nuri William Emanetoglu, Woodbury, NJ (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 0 days.

(21) Appl. No.: 10/266,130

(22) Filed: Oct. 7, 2002

(65) Prior Publication Data

US 2003/0129307 A1 Jul. 10, 2003

Related U.S. Application Data

(60) Provisional application No. 60/344,360, filed on Jan. 4, 2002.

(51) Int. Cl.⁷ .......................... B05D 5/12; C23C 14/00; C23C 16/00
(52) U.S. Cl. .................. 427/100; 427/255.28; 427/596; 204/192.1
(58) Field of Search .......................... 427/100, 255.28, 427/596; 204/192.1

(56) References Cited

U.S. PATENT DOCUMENTS 6,593,679 B2 * 7/2003 Higuchi et al. ......... 310/313 A

OTHER PUBLICATIONS

Emanetoglu et al., "MgxZn1–xO: A New Piezoelectric Material", 2001 IEEE Ultrasonics Symposium, Oct. 7, 2001, pp. 253–256.*

Emanetoglu, et al. "Analysis of SAW Properties of Epitaxial ZnO Films Grown on R–$Al_2O_3$ Substrates ". IEEE Transactions on Ultrasonics, Ferroelectrics, and Frequency Control, vol. 48, No. 5, Sep. 2001, pp. 1389–1394.

Wu, et al. "Temperature Compensation of SAW in ZnO/$SiO_2$/Si Structure". 2001 IEEE Ultrasonics Symposium, pp. 211–214.

Gorla, et al. "Structural, optical, and surface acoustic wave properties of epitaxial ZnO films grown on (0112) sapphire by metalorganic chemical vapor deposition". Journal of Applied Physics, vol. 85, No. 5, Mar. 1, 1999, pp. 2595–2602.

Muthukumar, et al. "Control of morphology and orientation of ZnO thin films grown on $SiO_2$/Si substrates". Journal of Crystal Growth 225 (2001), pp. 197–201.

Emanetoglu, et al. "$Mg_xZn_{1-x}O$: A New Piezoelectric Material". 2001 IEEE Ultrasonics Symposium, pp. 253–256.

(List continued on next page.)

*Primary Examiner*—Michael Barr
(74) *Attorney, Agent, or Firm*—Hoffmann & Baron, LLP

(57) ABSTRACT

The present invention provides magnesium zinc oxide ($Mg_xZn_{1-x}O$) as a new piezoelectric material, which is formed by alloying ZnO and MgO. $Mg_xZn_{1-x}O$ allows for flexibility in thin film SAW and BAW device design, as its piezoelectric properties can be tailored by controlling the Mg content, as well as by using $Mg_xZn_{1-x}O$/ZnO multilayer structures. To experimentally prove it, the $Mg_xZn_{1-x}O$ ($x \leq 0.35$) thin films are grown on r-plane sapphire substrates at a temperature in the range of 400° C.–500° C. by metalorganic chemical vapor deposition. $Mg_xZn_{1-x}O$ films with Mg mole percent up to 0.35 have epitaxial quality and wurtzite crystal structure. The SAW properties, including velocity dispersion and piezoelectric coupling, are characterized and concluded that the acoustic velocity increases, whereas the piezoelectric coupling decreases with increasing Mg mole percent in piezoelectric $Mg_xZn_{1-x}O$ films.

22 Claims, 7 Drawing Sheets

OTHER PUBLICATIONS

Zhu, et al. "A Multi–IDT Input Tunable Surface Acoustic Wave Filter". IEEE Transactions on Ultrasonics, Ferroelectrics, and Frequency Control, vol. 48, No. 5, Sep. 2001, pp. 1383–1388.

Wittstruck, et al. "Analysis of BAW Responses in ZnO Multi–Layer Structures Using Transmission Line Method". 2000 IEEE Ultrasonics Symposium.

Emanetoglu, et al. "Analysis of Temperature Compensated SAW Modes in $ZnO/SiO_2/Si$ Multilayer Structures". 2000 IEEE Ultrasonics Symposium.

Zhu, et al. "A Prototype of Tunable Surface Acoustic Wave Filter". 1999 IEEE Ultrasonics Symposium, pp. 47–50.

Emanetoglu, et al. "MOCVD Growth and SAW Properties of Epitaxial ZnO Thin Films". 1998 IEEE International Frequency Control Symposium, pp. 790–795.

Emanetoglu, et al. "Epitaxial ZnO piezoelectric thin films for saw filters". Materials Science in Semiconductor Processing 2 (1999), pp. 247–252.

Sittig, Erhard K. "Transmission Parameters of Thickness–Driven Piezoelectric Transducers Arranged in Multilayer Configurations". IEEE Transactions on Sonics and Ultrasonics, vol. SU–14, No. 4, Oct. 1967, pp. 167–174.

Akcakaya, et al. "Anisotropic Superlattice Transducers: Characteristics and Models". 1988 Ultrasonic Symposium, pp. 333–338.

Akcakaya, et al. "Apodization of Multilayer Bulk–Wave Transducers". IEEE Transactions on Ultrasonics, Ferroelectrics, and Frequency Control, vol. 36, No. 6, Nov. 1989, pp. 628–637.

Wang, et al. "Sputtered C–axis Inclined ZnO Films for Shear Wave Resonators". 1982 Ultrasonics Symposium, pp. 480–483.

Hadimioglu, et al. "Multilayer ZnO Acoustic Transducers at Millimeter–Wave Frequencies". 1987 Ultrasonics Symposium, pp. 717–720.

Hu, et al. "Preparation of piezoelectric–coefficient modulated multilayer film $ZnO/Al_2O_3$ and its ultrahigh frequency resonance". Appl. Phys. Lett. 71 (4), Jul. 28, 1997, pp. 548–550.

Deger, et al. "Sound velocity of $Al_xGa_{1-x}N$ thin films obtained by surface acoustic–wave measurements". Applied Physics Letters, vol. 72, No. 19, May 11, 1998, pp. 2400–2402.

Chen, et al. "High–frequency resonance in acoustic superlattice of periodically poled $LiTaO_3$". Appl. Phys. Lett. 70 (5), Feb. 3, 1997, pp. 592–594.

Gnewuch, et al. "'Crossed–Field' Excitation of an Acoustic Superlattice with Matched Boundaries: Theory and Experiment". IEEE Transactions on Ultrasonics, Ferroelectrics, and Frequency Control, vol. 47, No. 6, Nov. 2000, pp. 1619–1622.

Ohtomo, et al. "$Mg_xZn_{1-x}O$ as a II–VI widegap semiconductor alloy". Applied Physics Letters, vol. 72, No. 19, May 11, 1998, pp. 2466–2468.

Ohtomo, et al. "Structure and optical properties of $ZnO/Mg_{0.2}Zn_{0.8}O$ superlattices". Applied Physics Letters, vol. 75, No. 7, Aug. 16, 1999, pp. 980–982.

\* cited by examiner

Figure 2. (a) RBS spectra    (b) transmission spectra

Figure 4. (a) Velocity dispersion  (b) piezoelectric coupling curves

Figure 5. (a) Velocity dispersion and (b) piezoelectric coupling curves

Figure 6. (a) Velocity dispersion and (b) piezoelectric coupling curves

TAILORING PIEZOELECTRIC PROPERTIES USING MGXZN1-XO/ZNO MATERIAL AND MGXZN1-XO/ZNO STRUCTURES

CROSS REFERENCE TO RELATED APPLICATIONS

This application claims priority to Provisional Application No. 60/344,360 filed on Jan. 4, 2002 and entitled "Bulk Acoustic Wave Device".

This invention was made with Government support under Grant No. NSF-ECS 0088549 and NSF-CCR 0103096, awarded by the National Science Foundation. Therefore, the United States Government has certain rights in this invention.

FIELD OF THE INVENTION

This invention relates to the use of $Mg_xZn_{1-x}O$ based materials and structures for acoustic devices, and more particularly, to the tailoring of the piezoelectric properties to achieve flexibility in the Surface Acoustic Wave (SAW) and Bulk Acoustic Wave (BAW) design and fabrication for applications in telecommunications and various sensors.

BACKGROUND OF THE INVENTION

Currently, several technologies exist that provide modifying the piezoelectric properties in ZnO based multilayer structures. Theoretical analysis was reported for multilayers of two different materials (see E. K. Sittig "Transmission Parameters of Thickness-Driven Piezoelectric Transducers Arranged in Multilayer Configurations", *IEEE Trans. SU*, SU-14 (4), 167, October 1967), and for off-axis ZnO multilayers (see E. Akcakaya, E. L. Adler, G. W. Farnell, "Apodization of Multilayer Bulk-Wave Transducers", *IEEE Trans. UFFC*, 36(6), 628, November 1989 and E. Akcakaya, E. L. Adler, G. W. Farnell, "Anisotropic Superlattice Transducers: Characteristics and Models", *Proc. IEEE 1988 International Ultrasonics Symposium*, 333, 1988). E. K. Sittig shows individual transducers consisting of multiplicity of piezoelectrically active layers electrically connected with conductive or non-conductive layers of different characteristics acoustic impedances. Akcakaya et al discloses calculating electromechanical characteristics of transducers consisting of multilayers of ZnO with alternating crystal orientation. BAW thin film resonators (TFRs) using sputter deposited off-axis ZnO multilayers with alternating crystal structure were demonstrated by J. S. Wang, K. M. Lakin, ("Sputtered C-axis Inclined ZnO Films for Shear Wave Resonators", *Proc. IEEE 1982 International Ultrasonics Symposium*, 480, 1982) and by B. Hadimioglu, L. J. La Comb, Jr., L. C. Goddard, B. T. Khuri-Yajub, C. F. Quate, E. L. Ginzton, ("Multilayer ZnO Acoustic Transducers at Millimeter-Wave Frequencies", *Proc. IEEE 1987 International Ultrasonics Symposium*, 717, 1987.) BAW TFRs using alternating multilayers of ZnO and non-piezoelectric materials were demonstrated by W. S. Hu, Z. G. Liu, R. X. Wu, Y. F. Chen, W. Ji, T. Yu, D. Feng, ("Preparation of Piezoelectric-Coefficient Modulated Multilayer Film ZnO/$Al_2O_3$ and its Ultrahigh Frequency Response", *Appl. Phys. Lett.*, 71(4), p. 548, July 1997). Piezoelectric property tailoring in the ternary compound $Al_xGa_{1-x}N$, was demonstrated by C. Deger, E. Born, H. Angerer, O. Ambacher, M. Stutzmann, J. Hornsteiner, E. Riha, G. Fischerauer, ("Sound velocity of $Al_xGa_{1-x}N$ thin films obtained by surface acoustic wave measurements", *Appl. Phys. Lett.*, 72(19), p. 2400, May 1998). Deger et al shows determining SAW and BAW velocities in $Al_xGa_{1-x}N$ thin films by tailoring the piezoelectric properties of $Al_xGa_{1-x}N$ films. Y. F. Chen, S. N. Zhu, Y. Y. Zhu, N. B. Ming, B. B. Jin, R. X. Wu, "High-frequency Resonance in Acoustic Superlattice of Periodically Poled $LiTaO_3$", *Appl. Phys. Lett.*, 70(5), 592, February 1997 and H. Gnewuch, N. K. Zayer, C. N. Pannell, "Crossed-Field Excitation of an Acoustic Superlattice with Matched Boundaries: Theory and Experiment", *IEEE Trans, UFFC*, 47(6), 1619, November 2000 describe a piezoelectric property tailoring method suitable only for those piezoelectric materials which are also ferroelectric materials facilitating construction of acoustic superlattice (ASL) and optic superlattice (OSL) devices.

Piezoelectric ZnO thin films have been used for multilayer SAW and BAW devices due to the high electromechanical coupling coefficients (see F. Moeller, T. Vandahl, D. C. Malocha, N. Schwesinger, W. Buff, "Properties of thick ZnO layers on oxidized silicon", *Proc. 1994 IEEE Int. Ultrasonics Symp.*, pp. 403–406; Kim, Hunt, Hickernell, Higgins, Jen, "ZnO Films on {011}-Cut<110>-Propagating GaAs Substrates for Surface Acoustic Wave Device Applications", *IEEE Trans. Ultrasonics, Ferroelectrics and Frequency Control*, v. 42, no3, pp. 351–361, May 1995; H. Ieki, H. Tanaka, J. Koike, T. Nishikawa, "Microwave Low Insertion Loss SAW Filter by Using ZnO/Sapphire Substrate with Ni Dopant", 1996 *IEEE MTT-S Digest*, pp. 409–412; and H. Nakahata, H. Kitabayashi, S. Fujii, K. Higaki, K. Tanabe, Y. Seki, S. Shikata, "Fabrication of 2.5 GHz Retiming Filter with $SiO_2$/ZnO/Diamond Structure", *Proc. 1996 IEEE Int. Ultrasonics Symp.*, pp. 285–288). Recently, the ternary compound magnesium zinc oxide ($Mg_xZn_{1-x}O$), formed by alloying ZnO with MgO, has attracted increasing interest for UV optoelectronic applications (see A. Ohtomo, M. Kawasaki, T. Koida, K. Masubuchi, H. Koinuma, Y. Sakurai, Y. Yoshida, T. Yasuda, Y. Segawa, "$Mg_xZn_{1-x}O$ as a II–VI widegap semiconductor alloy", *Appl. Phys. Lett.*, vol. 72, n. 19, pp. 2466–2468, May 11, 1998; A. K. Sharma, J. Narayan, J. F. Muth, C. W. Teng, C. Jin, A. Kvit, R. M. Kolbas, O. W. Holland, "Optical and structural properties of epitaxial $Mg_xZn_{1-x}O$ alloys", *Appl. Phys. Lett.*, vol. 75, n.21, pp. 3327–3329; and T. Minemoto, T. Negami, S. Nishiwaki, H. Takakura, Y. Hamakawa, "Preparation of $Zn_{1-x}Mg_xO$ films by radio frequency magnetron sputtering", *Thin Solid Films*, vo. 372, pp. 173–176, Sep. 1, 2000). Its energy bandgap can be extended from 3.3 eV (ZnO) to 4.05 eV ($Mg_{0.35}Zn_{0.65}O$). Although the solid solubility limit of MgO in ZnO is less than 5% in equilibrium conditions, a higher range of Mg composition can be achieved using non-equilibrium growth methods.

Currently, the ZnO film thickness and the dimensions of the devices (such as SAW filters) were the only parameters available for modification, limiting the design flexibility, as well as the processing latitude. It would be useful to provide a SAW or a BAW device in which their characteristics can be tuned using other parameters.

SUMMARY OF THE INVENTION

The present invention provides a method of controlling piezoelectric properties in various acoustic devices. The method involves using $Mg_xZn_{1-x}O$ film as a new piezoelectric material and adjusting Mg mole percent in the $Mg_xZn_{1-x}O$ film to tailor piezoelectric properties in the $Mg_xZn_{1-x}O$ film. Similarly, the method further involves using $Mg_xZn_{1-x}O$/ZnO as a new piezoelectric multilayer structure and adjusting Mg mole percent in the $Mg_xZn_{1-x}O$ to tailor piezoelectric properties in the acoustic devices. Thus, the piezoelectric properties in ZnO based devices can be tailored by using $Mg_xZn_{1-x}O$/ZnO multiplayer structures as well as by using $Mg_xZn_{1-x}O$ single layer with controlled Mg composition.

In addition to being piezoelectric, both ZnO and $Mg_xZn_{1-x}O$ are wide-bandgap semiconductors. Thus piezoelectric and semiconductor devices can be integrated on the same material system. This leads to new classes of devices with integrated features and tunability.

DETAILED DESCRIPTION OF THE PREFERRED EMBODIMENTS

Figure 1:
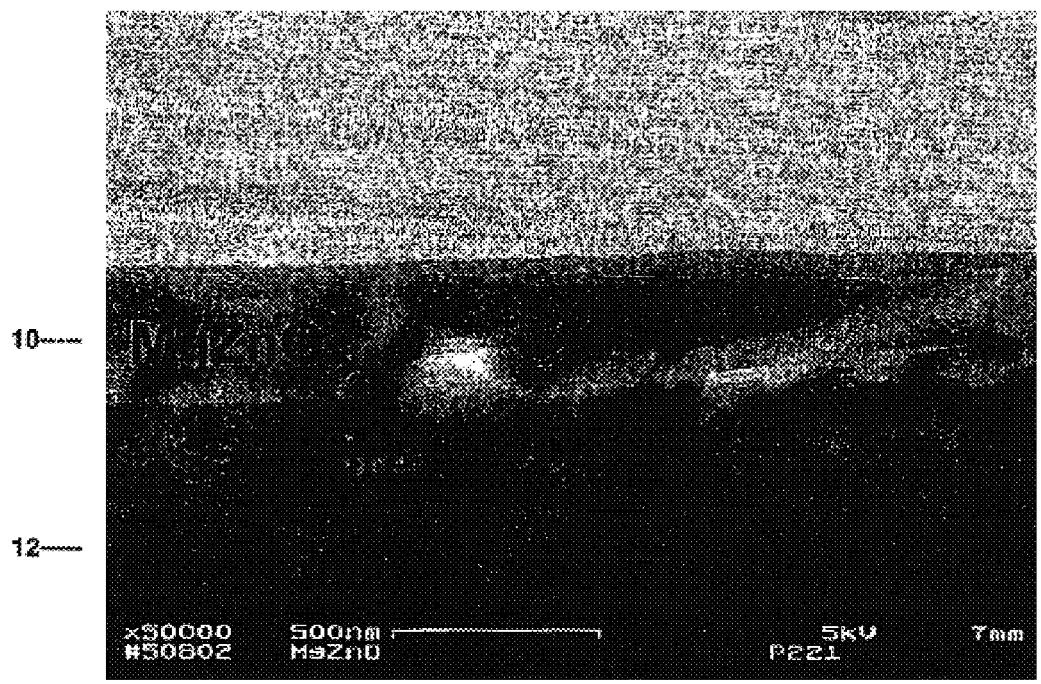
FIG. 1 shows a cross-sectional field-emission scanning electron microscope image of a fractured surface of $Mg_{0.3}Zn_{0.7}O$ thin film grown on r-$Al_2O_3$.

ZnO belongs to the wurtzite crystal group, and is a well-known piezoelectric material, which has been successfully used for surface acoustic wave (SAW) and bulk acoustic wave (BAW) devices. Whereas, MgO is a non-piezoelectric material with a cubic rocksalt structure. In comparison with ZnO, MgO has higher longitudinal and transverse bulk acoustic wave velocities. By alloying ZnO and MgO, one can get a ternary compound, $Mg_xZn_{1-x}O$. For Mg mole percent above 35%, the $Mg_xZn_{1-x}O$ film has a cubic structure, which is not piezoelectric. Whereas, for the range of Mg mole percent below approximately 35% (x~0.35), the $Mg_xZn_{1-x}O$ crystal retains the wurtzite structure. In the present invention, it has been discovered that $Mg_xZn_{1-x}O$ will be piezoelectric until the phase transition point as will be discussed in detail later.

The present invention provides a means for flexible design devices by controlling the Mg content in a piezoelectric $Mg_xZn_{1-x}O$ film. In the films of the present invention, the acoustic velocity increases, whereas the piezoelectric coupling decreases with increasing Mg composition. Thus, in an embodiment of the present invention, the piezoelectric properties in ZnO based devices can be tailored by using $Mg_xZn_{1-x}O$/ZnO multilayer structures as well as by using $Mg_xZn_{1-x}O$ single layer with controlled Mg composition.

In a broad aspect of the present invention, $Mg_xZn_{1-x}O$ films, with preferably up to 35% Mg, are grown by metalorganic chemical vapor deposition (MOCVD) on r-$Al_2O_3$ substrates using a vertical rotating-disc MOCVD reactor. The MOCVD system and process used for $Mg_xZn_{1-x}O$ films are similar to that for ZnO as shown by C. R. Gorla, N. W. Emanetoglu, S. Liang, W. E. Mayo, Y. Lu, M. Wraback, H. Shen, "Structural, optical, and surface acoustic wave properties of epitaxial ZnO films grown on (01-12) sapphire by metalorganic chemical vapor deposition", J. Appl. Phys., vol. 85, n. 5, pp. 2595–2602, Mar. 1, 1999. Diethyl zinc (DEZn) and $(MCP)_2Mg$ are the precursors for Zn and Mg, respectively. $O_2$ is the oxidizer. A very thin ZnO buffer layer approximately 50 nm is first grown, followed by the $Mg_xZn_{1-x}O$ film layer at a temperature preferably in the range of 400–500° C. In the experiments, the films' thicknesses ranged preferably from 0.35 $\mu$m to 1.5 $\mu$m. The resistivity of the films increases with increasing the Mg composition (x). The as-grown films were conductive, and in current work, a solid source Li diffusion process was developed to be used for the composition doping to increase the resistivity above $10^7$ □-cm to achieve good piezoelectricity. The piezoelectric properties of the $Mg_xZn_{1-x}O$ are achieved by in situ compensation doping during deposition of the $Mg_xZn_{1-x}O$ and ex-situ compensation doping after deposition of the $Mg_xZn_{1-x}O$. In this case, as mentioned earlier, Li, Lithium was used for doping. Even though MOCVD is the process used to grow the $Mg_xZn_{1-x}O$ films, it is to be noted that $Mg_xZn_{1-x}O$ films can also be grown by deposition technologies including but not limited to pulse-laser deposition (PLD), molecular beam epitaxy (MBE), and sputtering.

Figure 2:
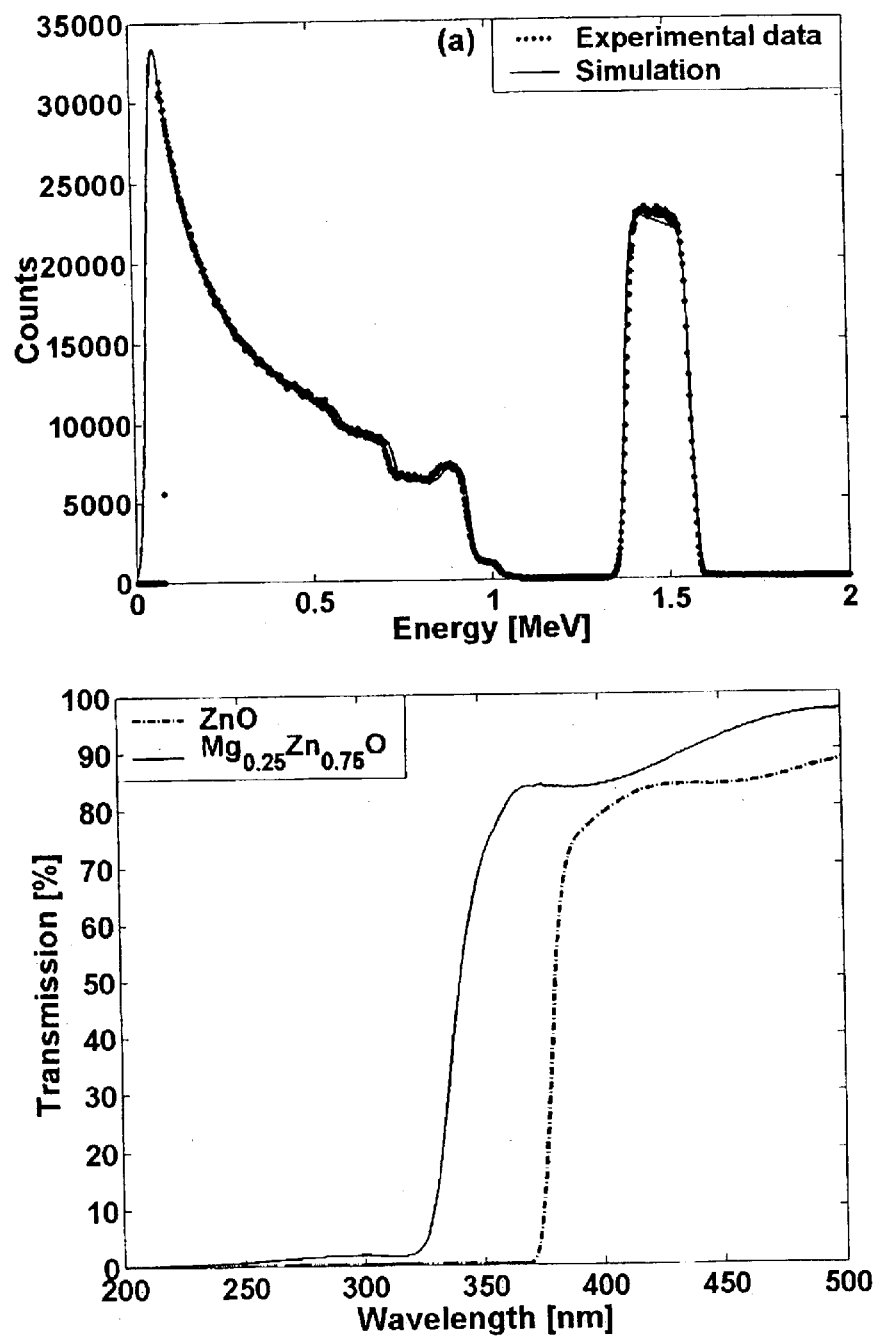
FIG. 2a shows a graph of Rutherford Back-Scattering spectra as a function of energy for $Mg_{0.25}Zn_{0.75}O$ film grown on r-plane sapphire.
FIG. 2b shows a graph of transmission spectra as a function of wavelength for $Mg_{0.25}Zn_{0.75}O$ film and ZnO film grown on r-plane sapphire, respectively.

Referring to FIG. 1, in an embodiment of the present invention, there is shown a field-emission scanning electron microscope (FE-SEM) picture of a $Mg_{0.3}Zn_{0.7}O$ film 10 grown on r-plane $Al_2O_3$ 12 with a thin ZnO buffer layer (can not be seen in the FIG. 1 due to very small thickness). The film is smooth and dense. As discussed above, thin ZnO buffer layer is first grown on r-plane $Al_2O_3$ substrate 12. Then $Mg_{0.3}Zn_{0.7}O$ is grown on the ZnO buffer layer. The film's Mg composition is determined using Rutherford Back-Scattering (RBS) and optical absorption/transmission measurements as shown in FIG. 2. FIG. 2(a) is the RBS spectrum of a $Mg_{0.25}Zn_{0.75}O$ film with 25% Mg mole percent grown on r-plane sapphire substrate. The solid line is the simulated results and the dotted line is the measured data. As apparent from the graph, the simulation and experimental data are almost the same. Shown in FIG. 2(b) is the optical transmission spectrum of the $Mg_{0.25}Zn_{0.75}O$ film. A ZnO film's optical transmission spectrum is also shown for comparison. It can be seen that the cut-off wavelength has a shift with increasing Mg mole percent, going from 373 nm for ZnO with 0% Mg content to 330 nm for $Mg_{0.25}Zn_{0.75}O$ with 25% Mg content.

Figure 3:
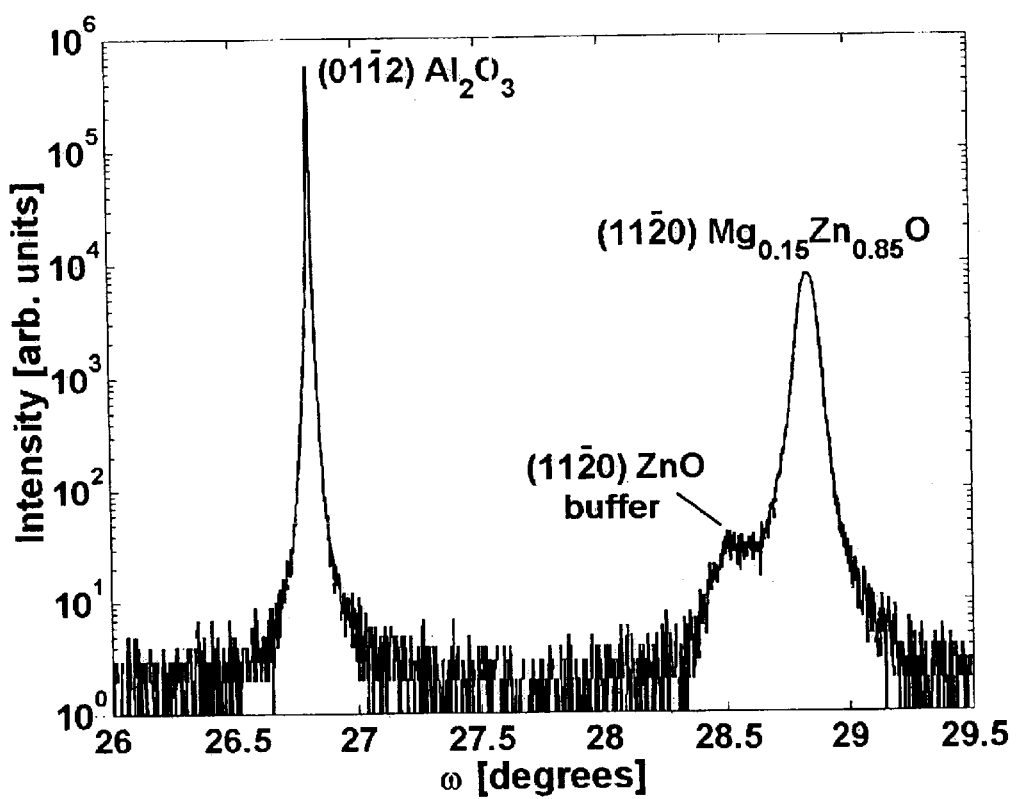
FIG. 3 shows a semi-logarithmic plot of the X-ray $\omega$-$2\theta$ scan of $Mg_{0.15}Zn_{0.85}O$ film grown on r-plane sapphire.

FIG. 3 shows the X-ray $\omega$-$2\theta$ scan of $Mg_{0.15}Zn_{0.85}O$ film grown on r-plane sapphire. This plot of the X-ray $\omega$-$2\theta$ scan determines two critical features of the $Mg_xZn_{1-x}O$ films. One is the crystal structure and the other is the epitaxial quality of the $Mg_xZn_{1-x}O$ films. The full width half maximum (FWHM) of the X-ray diffraction double crystal diffractometer rocking curve of the film is 0.27°. X-ray results confirm that the $Mg_xZn_{1-x}O$ films have the same wurtzite structure as ZnO for Mg mole percent below 35%. X-ray $\omega$-2$\theta$ scans show the $Mg_xZn_{1-x}O$ films have epitaxial quality, and have the same epitaxial relationships with the substrate as ZnO on r-$Al_2O_3$. The epitaxial relationships between the film and the substrate are $(11\bar{2}0)$ $Mg_xZn_{1-x}O//(01\bar{1}2)$ $Al_2O_3$ and $(0001)$ $Mg_xZn_{1-x}O//(0\bar{1}11)$ $Al_2O_3$. Thus, the c-axis of the $Mg_xZn_{1-x}O$ films is in the growth plane. The secondary peak shown in FIG. 3 is due to the misfit strain near the film substrate interface, which is accommodated in the ZnO buffer. This is the transition phase from ZnO buffer to $Mg_xZn_{1-x}O$ film.

In the present invention, preferably, two types of test devices are designed, a set of delay lines of different wavelengths with regular IDTs, and a set of delay lines with harmonic transducers. The first set of delay lines use quarter wavelength, for example, $\lambda$=6, 8 and 10 $\mu$m, while the second set uses split-electrode, for example, $\lambda$=12, 16 and 20 $\mu$m transducers. Two delay lines with IDT center-to-center distance of 1000 and 2000 $\mu$m are used for each wavelength. Three types of harmonic transducers are designed. The first type having $\lambda$=12 and 15 $\mu$m uses a standard two ground electrodes i.e., one signal electrode design to suppress every third harmonic. The second type having $\lambda$=12 $\mu$m was designed to excite the first four harmonics, while the third type having $\lambda$=14 $\mu$m was designed to excite the first six harmonics. The IDT apertures are 180 $\mu$m for all devices. The piezoelectric properties have in-plane anisotropy, as a result of the $Mg_xZn_{1-x}O$ c-axis being in the surface plane. The test devices are aligned parallel and perpendicular to the c-axis of the $Mg_xZn_{1-x}O$ films, to generate both Rayleigh and Love wave modes, respectively. Rayleigh-type wave modes propagating parallel to the c-axis are used for gas-phase sensing, whereas Love type wave modes propagating perpendicular to the c-axis are used for liquid-phase sensing. Rayleigh-type wave modes have higher acoustic velocities than that of Love-type wave modes. However, Love-type wave modes are advantageous for sensors operating in liquid environments, due to the surface horizontal wave motion. Thus, Love waves propagate with low loss in a liquid, while Rayleigh waves are rapidly attenuated due to viscous losses.

The device fabrication process consists of e-beam evaporation of 1500 Å of Al, followed by photolithography and etching to form the IDTs. This was followed by image reversal photolithography, e-beam evaporation of 5000 Å of Al, and lift-off to form bond pads. The devices were then tested on-wafer using a Cascade Microtech probe station and a HP 8753D network analyzer. The measured data were exported to a PC, and compared with simulation results using MATLAB. The acoustic velocity was inferred from the data using the relationship $v_{SAW}=f_c\lambda_0$, where $f_c$ is the center frequency, and $\lambda_0$ is the design wavelength.

SAW properties of the $Mg_xZn_{1-x}O$/r-$Al_2O_3$ system, including $v_{SAW}$ and $k^2$, were simulated using the transfer matrix method disclosed by E. L. Adler, "Matrix methods applied to acoustic waves in multilayers", *IEEE Trans. Ultrasonics, Ferroelectrics and Frequency Control*, vol. 37, no. 6, pp. 485–490, November 1990).

In order to simulate the SAW properties, the relevant $Mg_xZn_{1-x}O$ material constants, including mass density, stiffness, piezoelectric and dielectric constants, need to be determined. To date, experimentally measured values for $Mg_xZn_{1-x}O$ material constants are not available, as it is a new material. So, these constants were calculated by using the material constants of the binary compounds ZnO and MgO as shown in Table 1 below. MgO and ZnO belong to different crystal groups. In order to calculate the material constants of the ternary, the cubic MgO material constants, such as stiffness coefficients, have to be transformed to the wurtzite phase. Based on Martin's method (see R. M. Martin, "Relation between elastic tensors of wurtzite and zinc-blende structure materials", *Phys. Rev. B.*, vol. 6, no. 12, pp. 4546–4553, Dec. 15, 1972), simplified stiffness coefficient vectors for the cubic ($c^{ZB}$) and wurtzite ($c^{WZ}$) phases are first defined:

$c_1^{ZB}=c_{11}^{ZB}, c_2^{ZB}=c_{12}^{ZB}, c_3^{ZB}=c_{44}^{ZB}$ $c_1^{WZ}=c_{11}^{WZ}, c_2^{WZ}=c_{33}^{WZ}, c_3^{WZ}=c_{12}^{WZ}, c_4^{WZ}=c_{13}^{WZ}, c_5^{WZ}=c_{44}^{WZ}, c_6^{WZ}=c_{66}^{WZ}$

The equations relating the two vectors are:

$$c_i^{WZ} = \bar{c}_i^{WZ} - D_i, \quad i=1, \ldots, 6$$

$\bar{c}^{WZ}$ are the average stiffness coefficients related to the cubic phase coefficients with the transformation matrix P:

$$\bar{c}_i^{WZ} = \sum_{j=1}^{3} P_{ij} c_j^{ZB}$$

$$P = \frac{1}{6}\begin{bmatrix} 3 & 3 & 6 \\ 2 & 4 & 8 \\ 1 & 5 & -2 \\ 2 & 4 & -4 \\ 2 & -2 & 2 \\ 1 & -1 & 4 \end{bmatrix}$$

D is the internal strain contribution related to the average stiffness equations:

$$D = \left[ \frac{\Delta^2}{\bar{c}_5^{WZ}}, 0, \frac{-\Delta^2}{\bar{c}_5^{WZ}}, 0, \frac{\Delta^2}{\bar{c}_6^{WZ}}, \frac{\Delta^2}{\bar{c}_5^{WZ}} \right]^T$$

$$\Delta = \sum_{j=1}^{3} Q_j c_j^{ZB}$$

$$Q = \frac{\sqrt{2}}{6}[1 \quad -1 \quad -2]$$

The $Mg_xZn_{1-x}O$ material constants were then estimated using the first order approximation of Veggard's law:

$$C_{Mg_xZn_{1-x}O} = xC_{MgO} + (1-x)C_{ZnO}$$

where C is the appropriate material constant. The ZnO and MgO material constants used in the calculations are given in Table 1 below. The ZnO material constants were taken from the publication, J. G. Gualtieri, J. A. Kosinski, A. Ballato, "Piezoelectric Materials for Acoustic Wave Applications", *IEEE Trans. Ultrasonics, Ferroelectrics and Frequency Control*, vol. 41, n.1, 53–59, January 1994, and MgO constants from the publication, B. A. Auld, *Acoustic Fields and Waves in Solids, Volume 1*, $2^{nd}$ ed., Krieger Publishing Company, Malabar, Fla., 1990, Appendix 2. It should be noted that two sets of ZnO material constants are provided, one for bulk and for sputter deposited films. The bulk ZnO constants are used in the present invention due to the high quality of the epitaxial ZnO films on sapphire (see C. R. Gorla, N. W. Emanetoglu, S. Liang, W. E. Mayo, Y. Lu, M. Wraback, H. Shen, "Structural, optical, and surface acoustic wave properties of epitaxial ZnO films grown on (01-12) sapphire by metalorganic chemical vapor deposition", *J. Appl. Phys.*, vol. 85, n. 5, pp. 2595–2602, Mar. 1, 1999), and because they give a better fit for measured data (see N. W.

Emanetoglu, G. Patounakis, S. Liang, C. R. Gorla, R. Wittstruck, Y. Lu, "Analysis of SAW Properties of Epitaxial ZnO Films Grown on r-Al$_2$O$_3$ Substrates", *IEEE Trans. Ultrasonics, Ferroelectrics and Frequency Control*, vol. 48, n.5, 1389–94, September 2001).

TABLE 1

ZnO and MgO material properties

|  | ZnO | MgO |
|---|---|---|
| Crystal structure | Wurtzite | Rock Salt |
| Stiffness constants [10$^{11}$ N/m$^2$] | $c_{11}$ = 2.09; $c_{33}$ = 2.106; $c_{12}$ = 1.205; $c_{13}$ = 1.046; $c_{44}$ = 0.423; $c_{66}$ = 0.4455 | $c_{11}$ = 2.86; $c_{12}$ = 0.87; $c_{44}$ = 1.48 |
| Dielectric constants (constant strain) | $\epsilon_{11}$ = 8.55; $\epsilon_{33}$ = 10.2 | $\epsilon_{11}$ = 9.6 |
| Density [kg/m$^3$] | 5665 | 3650 |
| Piezoelectric stress constants [C/m$^2$] | $e_{15}$ = −0.48; $e_{31}$ = −0.573; $e_{33}$ = 1.32 | Not piezoelectric |

Figure 4:
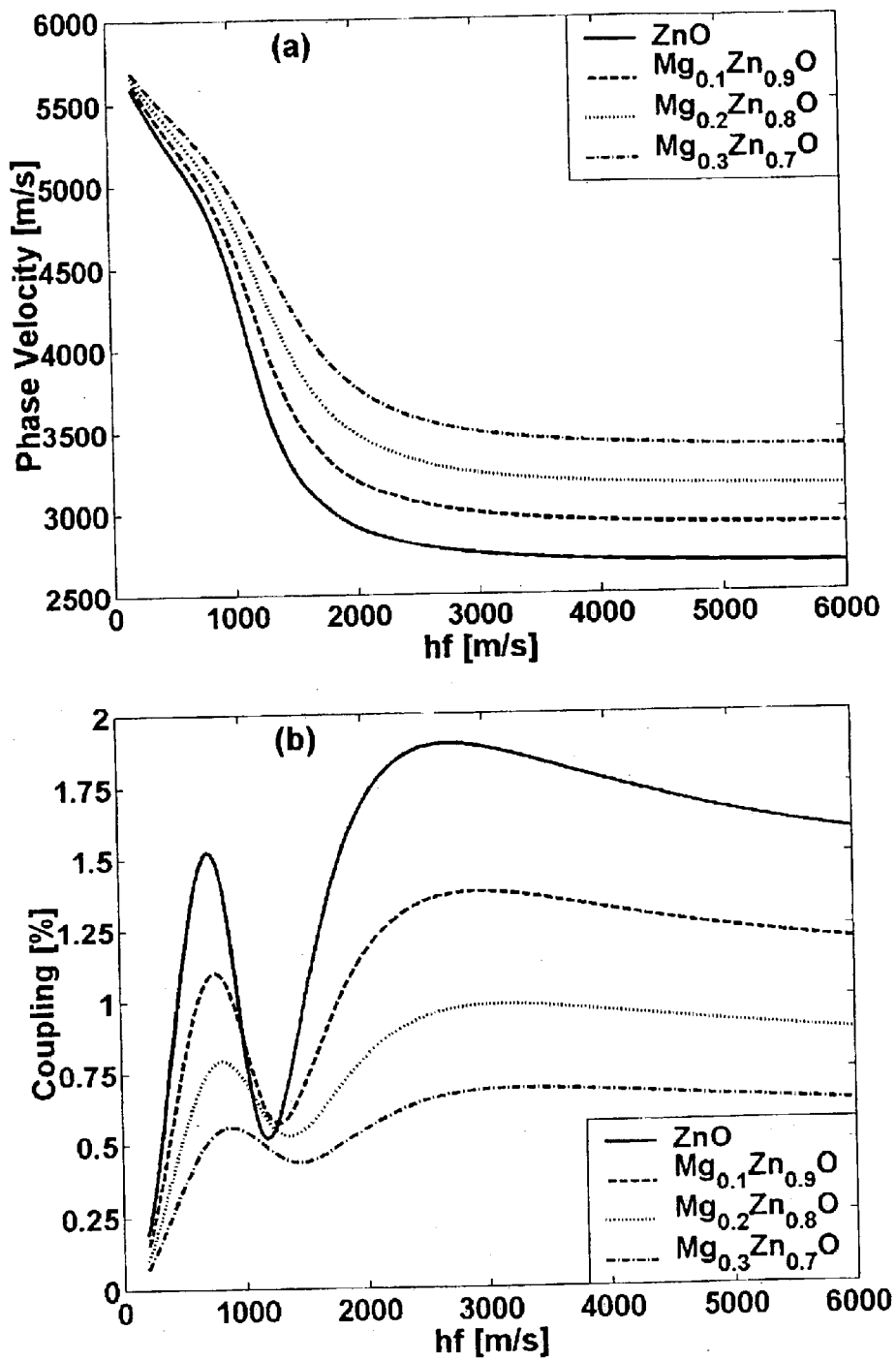
FIG. 4a shows a graph of calculated velocity dispersion versus the film thickness and frequency product for the Rayleigh wave mode propagating in the $Mg_xZn_{1-x}O$/r-$Al_2O_3$ system, with x=0 (ZnO), 0.1, 0.2 and 0.3.
FIG. 4b shows a graph of calculated piezoelectric coupling versus the film thickness and frequency product for the Rayleigh wave mode propagating in the $Mg_xZn_{1-x}O$/r-$Al_2O_3$ system, with x=0 (ZnO), 0.1, 0.2 and 0.3.

FIG. 4 presents the calculated velocity dispersion and piezoelectric coupling curves vs. the film thickness to frequency product (hf) also known as wavelength ratio (h/λ) for the Rayleigh wave mode in the Mg$_x$Zn$_{1-x}$O/r-Al$_2$O$_3$ system, with x=0 (ZnO), 0.1, 0.2 and 0.3. Solid line is represented by ZnO with x=0 i.e., zero Mg mole percent while dashed lines represent Mg$_x$Zn$_{1-x}$O with x=0.1, 0.2 and 0.3, i.e. 10%, 20% and 30% Mg mole percent respectively. As shown in FIG. 4a, for small values of hf, most of the energy of the SAW propagates in the sapphire substrate, and the velocity difference among the different compositions of Mg$_x$Zn$_{1-x}$O is quite small. At large hf values, the acoustic velocity difference becomes significant, up to approximately 721 m/s between ZnO and Mg$_{0.3}$Zn$_{0.7}$O for hf=5000 or h/λ=1. However, as shown in FIG. 4b, the diminishing effect of the Mg content on the piezoelectric coupling is apparent even at low values of hf. The maximum coupling coefficient (k$^2$) for the Rayleigh wave in ZnO/r-Al$_2$O$_3$ is 1.89% at hf=2720, while the maximum coupling coefficient in Mg$_{0.3}$Zn$_{0.7}$O/r-Al$_2$O$_3$ is 0.68% at hf=3340.

Figure 5:
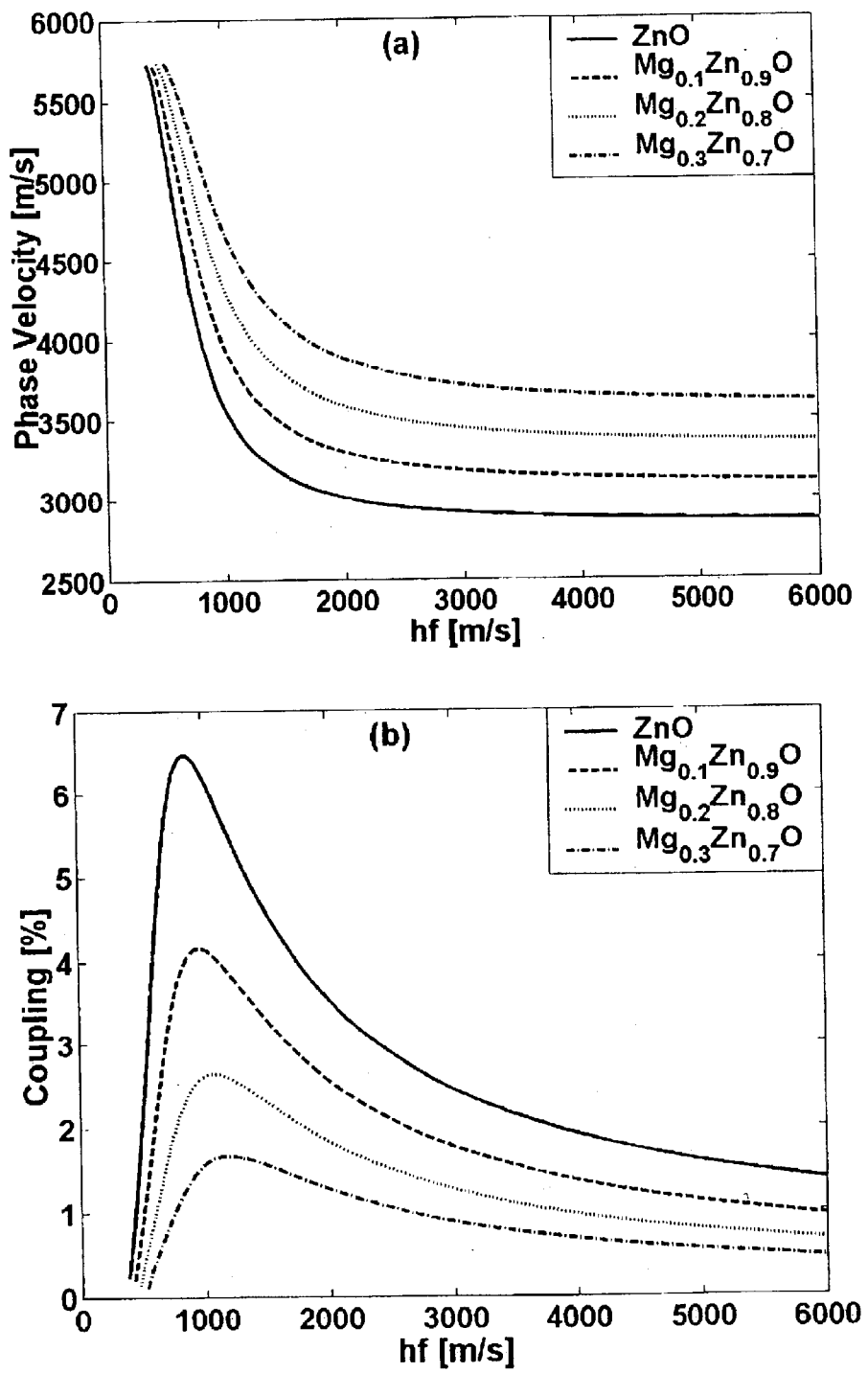
FIG. 5a shows a graph of calculated velocity dispersion versus the film thickness and frequency product for the Love wave mode propagating in the $Mg_xZn_{1-x}O$/r-$Al_2O_3$ system, with x=0 (ZnO), 0.1, 0.2 and 0.3.
FIG. 5b shows a graph of calculated piezoelectric coupling versus the film thickness and frequency product for the Love wave mode propagating in the $Mg_xZn_{1-x}O$/r-Al2O3 system, with x=0 (ZnO), 0.1, 0.2 and 0.3.

FIG. 5 presents the calculated velocity dispersion and piezoelectric coupling curves vs. the hf product for the Love wave mode in the Mg$_x$Zn$_{1-x}$O/r-Al$_2$O$_3$ system, with x=0 (ZnO), 0.1, 0.2 and 0.3. The Love wave mode behavior is similar to the Rayleigh wave behavior discussed above. The acoustic velocity difference is approximately 758 m/s between ZnO and Mg$_{0.3}$Zn$_{0.7}$O for hf=5000 as seen in FIG. 5a. The maximum coupling coefficient (k$^2$) for the Love wave in ZnO/r-Al$_2$O$_3$ is 6.46% at hf=860, while the maximum coupling in Mg$_{0.3}$Zn$_{0.7}$O/r-Al$_2$O$_3$ is 1.66% at hf=1190 as seen in FIG. 4a. In general, the piezoelectric coupling coefficient of the Love mode of Mg$_x$Zn$_{1-x}$O is higher than that of the Rayleigh mode.

Figure 6:
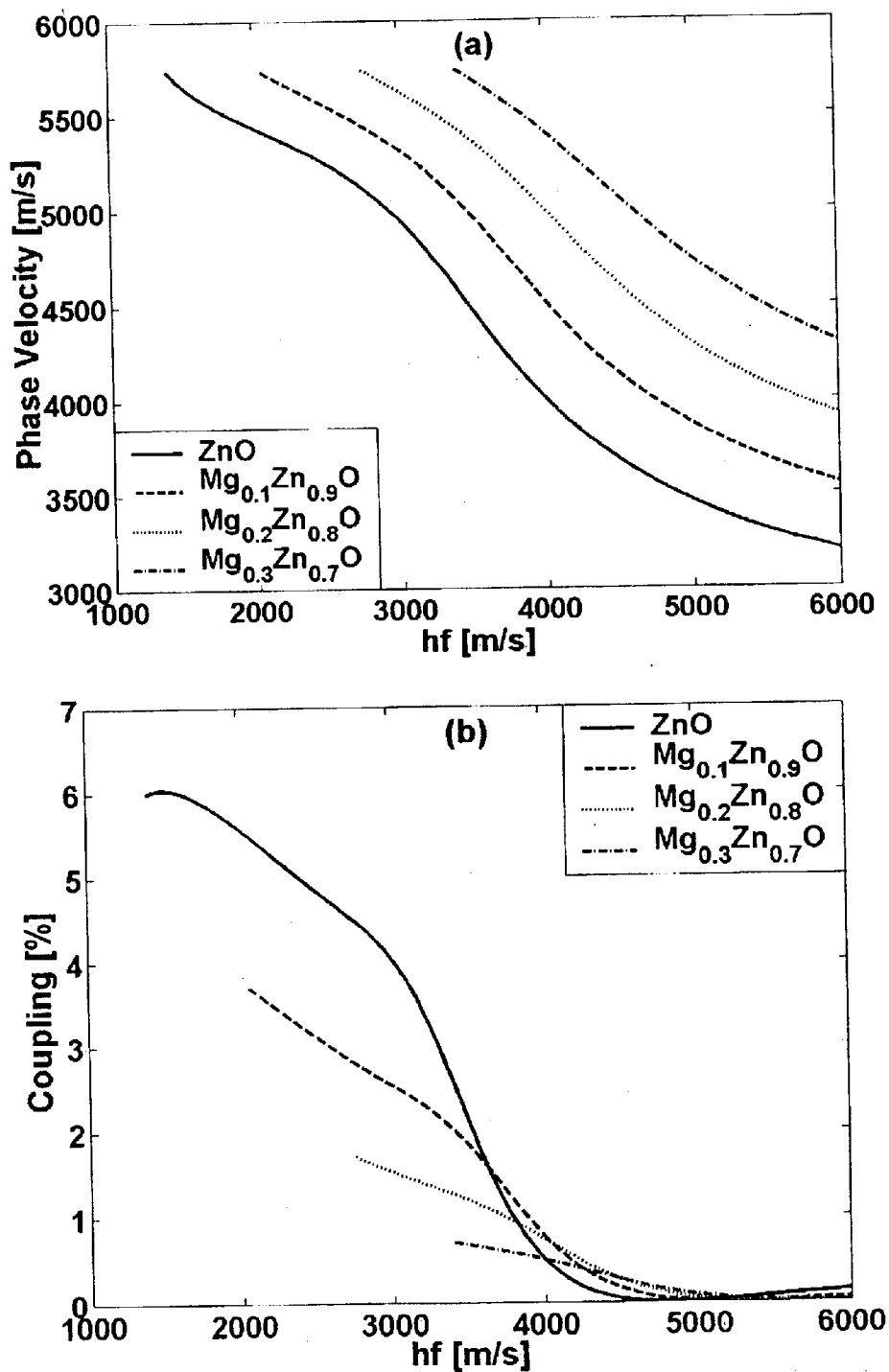
FIG. 6a shows a graph of calculated velocity dispersion versus the film thickness and frequency product for the Sezawa wave mode propagating in the $Mg_xZn_{1-x}O$/r-$Al_2O_3$ system, with x=0 (ZnO), 0.1, 0.2 and 0.3.
FIG. 6b shows a graph of calculated piezoelectric coupling versus the film thickness and frequency product for the Sezawa wave mode propagating in the $Mg_xZn_{1-x}O$/r-$Al_2O_3$ system, with x=0 (ZnO), 0.1, 0.2 and 0.3.

The Sezawa wave mode, which is the first higher order Rayleigh-type wave mode, is of special interest in the ZnO/r-Al$_2$O$_3$ system, as it has a high maximum piezoelectric coupling at a high velocity. Shown in FIG. 6 are the calculated velocity dispersion and piezoelectric coupling curves vs. the hf product for the Sezawa wave mode in the Mg$_x$Zn$_{1-x}$O/r-Al$_2$O$_3$ system, with x=0 (ZnO), 0.1, 0.2 and 0.3. The maximum coupling for the Sezawa wave in ZnO/r-Al$_2$O$_3$ is 6.03% at hf=1510 with a phase velocity of 5655.3 m/s, while the maximum coupling in Mg$_{0.3}$Zn$_{0.7}$O/r-Al$_2$O$_3$ is 0.7% at hf=3400 with a phase velocity of 5736.5 m/s. Thus, the maximum coupling of the Sezawa mode is similar to that of the Love wave mode in ZnO, with a much higher velocity. However, the Sezawa wave mode's maximum coupling decreases much faster than that of the Love wave mode as the Mg composition increases.

Figure 7:
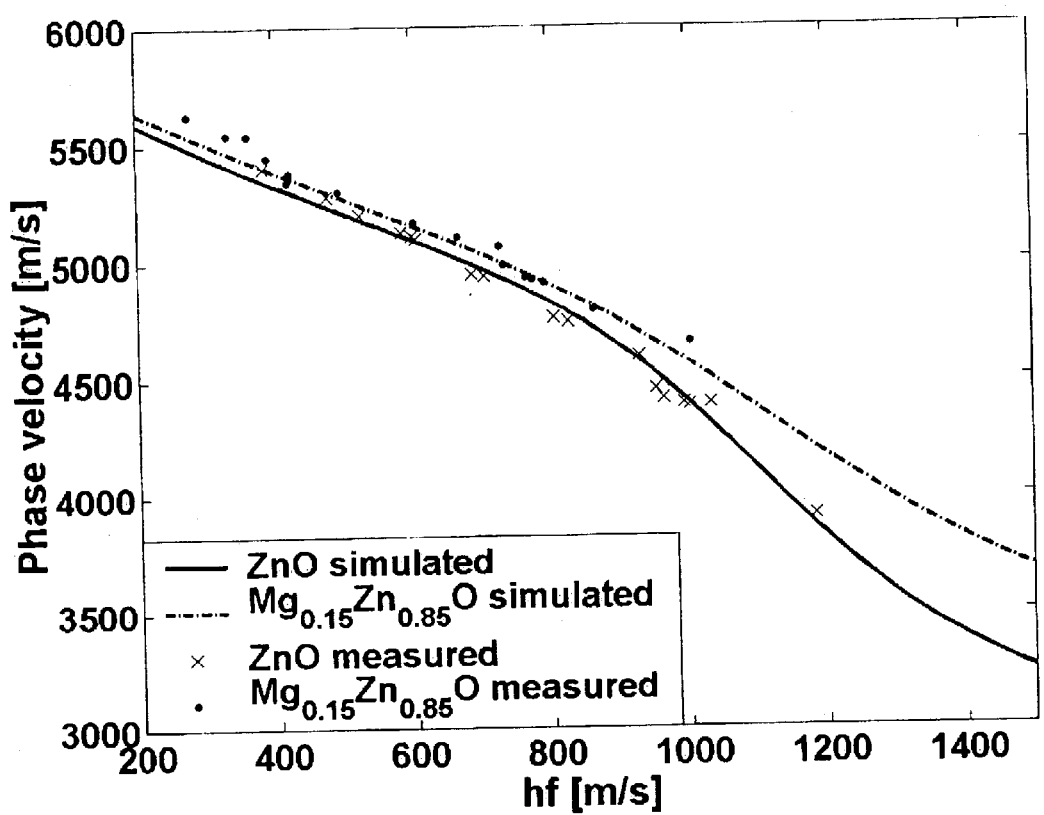
FIG. 7 shows a graph of a comparison of the Rayleigh wave velocities obtained from a 1.4 $\mu$m ZnO and a 1 $\mu$m $Mg_{0.15}Zn_{0.85}O$ film grown on r-$Al_2O_3$.

SAW testing devices are fabricated on ZnO, Mg$_{0.1}$Zn$_{0.9}$O, Mg$_{0.15}$Zn$_{0.85}$O and Mg$_{0.32}$Zn$_{0.68}$O thin films grown on r-Al$_2$O$_3$. FIG. 7 compares the Rayleigh wave velocities obtained from a 1.4 μm ZnO and a 1 μm Mg$_{0.15}$Zn$_{0.85}$O film grown on r-Al$_2$O$_3$. The experimental data are normalized by using the hf product. Simulation results are plotted with a solid line for ZnO and dashed line for Mg$_{0.15}$Zn$_{0.85}$O, while the measurement results are plotted with 'x' for ZnO and '●' for Mg$_{0.15}$Zn$_{0.85}$O. It is very clear that there is an increase in the SAW velocity for Mg$_{0.15}$Zn$_{0.85}$O compared to ZnO with zero Mg mole percent.

Similarly, BAW testing devices (not shown) are also fabricated on ZnO and Mg$_x$Zn$_{1-x}$O films grown on r-Al$_2$O$_3$. As discussed above, the amount of Mg mole percent in the Mg$_x$Zn$_{1-x}$O film is selected to tailor the piezoelectric characteristics including piezoelectric coupling coefficients and acoustic velocity. Furthermore, the Mg$_x$Zn$_{1-x}$O multilayer structures are used to tailor the BAW characteristics which include resonant frequency and shape of the frequency passband.

While the invention has been described in related to the preferred embodiments with several examples, it will be understood by those skilled in the art that various changes may be made without deviating from the fundamental nature and scope of the invention as defined in the appended claims.

What is claimed is:

1. A method of controlling piezoelectric properties in various acoustic devices, said method comprising:
   using Mg$_x$Zn$_{1-x}$O films as a new piezoelectric material; and
   adjusting an amount of Mg mole percent in the Mg$_x$Zn$_{1-x}$O film to tailor the piezoelectric properties in said Mg$_x$Zn$_{1-x}$O film.

2. The method of claim 1 further comprising:
   using ZnO/Mg$_x$Zn$_{1-x}$O as new piezoelectric multilayer structures; and
   adjusting the amount of Mg mole percent in said structure to tailor the piezoelectric properties of said structures, wherein said piezoelectric properties include piezoelectric coupling, acoustic velocity and a combination thereof.

3. The method of claim 2 further comprising:
   using a combination of said Mg$_x$Zn$_{1-x}$O films as a new piezoelectric material and said ZnO/Mg$_x$Zn$_{1-x}$O as new piezoelectric multilayer structures to tailor the piezoelectric properties in said acoustic devices.

4. The method of claim 1, wherein said Mg$_x$Zn$_{1-x}$O is formed by alloying piezoelectric ZnO with non-piezoelectric MgO.

5. The method of claim 1, wherein forming of said Mg$_x$Zn$_{1-x}$O films include metalorganic chemical vapor deposition, pulse-laser deposition, molecular beam epitaxy, and sputtering.

6. The method of claim 1, wherein said piezoelectric properties of the Mg$_x$Zn$_{1-x}$O are achieved by in-situ compensation doping during deposition of said Mg$_x$Zn$_{1-x}$O.

7. The method of claim 1, wherein said piezoelectric properties of the Mg$_x$Zn$_{1-x}$O are achieved by ex-situ compensation doping after deposition of said Mg$_x$Zn$_{1-x}$O.

8. The method of claim 1, wherein a maximum composition of said Mg mole percent is up to 35%.

9. The method of claim 8, wherein said Mg$_x$Zn$_{1-x}$O films have wurtzite crystal structure for the Mg mole percent below the 35%.

10. The method of claim 1 wherein said piezoelectric properties include piezoelectric coupling, acoustic velocity and a combination thereof.

11. The method of claim 10 wherein the acoustic velocity of said $Mg_xZn_{1-x}O$ film increases and the piezoelectric coupling of the $Mg_xZn_{1-x}O$ film decreases with increasing the amount of said Mg mole percent.

12. The method of claim 1 wherein said acoustic device is a surface acoustic wave device.

13. The method of claim 12 wherein said surface acoustic wave device comprises:

an (01 2) R-plane sapphire ($Al_2O_3$) substrate;

a thin buffer layer of ZnO deposited on said substrate;

said $Mg_xZn_{1-x}O$ film deposited on said ZnO buffer layer to form a multilayer of ZnO/$Mg_xZn_{1-x}O$ structure and the amount of Mg mole percent present is selected to control the piezoelectric properties of said surface acoustic wave device wherein said piezoelectric properties include piezoelectric coupling coefficients and acoustic velocity and a combination thereof; and interdigital transducer electrodes deposited on said multilayer structure.

14. The method of claim 13 further comprising:

adjusting the thickness of each layer of said structure and adjusting the Mg mole percent to tailor the piezoelectric properties of said surface acoustic wave device.

15. The method of claim 13 wherein said $Mg_xZn_{1-x}O$ film is in [110] direction with a c-axis of the $Mg_xZn_{1-x}O$ film lying parallel to the R-plane $Al_2O_3$, thereby providing in-plane anisotropy in said $Mg_xZn_{1-x}O$ film.

16. The method of claim 15, wherein the in-plane anisotropy in said $Mg_xZn_{1-x}O$ film permits surface acoustic wave sensors to operate in both gas-phase and liquid-phase.

17. The method of claim 16 wherein said surface acoustic wave sensors use Rayleigh waves modes propogating parallel to the c-axis of the $Mg_xZn_{1-x}O$ film and are advantageous for gas-phase sensing.

18. The method of claim 16 wherein said surface acoustic sensors use Love wave modes propagating perpendicular to the c-axis of the $Mg_xZn_{1-x}O$ film and are advantageous for operation in liquid environments.

19. The method of claim 2 wherein said acoustic device is a bulk acoustic wave device.

20. The method of claim 19 wherein the amount of Mg mole percent in the $Mg_xZn_{1-x}O$ film is selected to control the piezoelectric properties of said bulk acoustic wave device, wherein said piezoelectric properties include piezoelectric coupling coefficients and acoustic velocity and a combination thereof.

21. The method of claim 19 wherein the $Mg_xZn_{1-x}O$ multilayer structures are used to tailor the bulk acoustic wave characteristics.

22. The method of claim 21 wherein the said bulk acoustic wave device is a thin film resonator, and said tailor of the bulk acoustic wave characteristics include resonant frequency and shape of the frequency passband.

* * * * *

UNITED STATES PATENT AND TRADEMARK OFFICE
CERTIFICATE OF CORRECTION

PATENT NO. : 6,716,479 B2
DATED : April 6, 2004
INVENTOR(S) : Yicheng Lu et al.

It is certified that error appears in the above-identified patent and that said Letters Patent is hereby corrected as shown below:

Column 2,
Line 43, delete "...$Mg_{0.35}Zn_{065}O$. Although..." and insert -- $Mg_{0.35}Zn_{0.65}O$. Although --.

Column 3,
Line 10, delete "...$Mg_{0.3}Zn_{07}O$..." and insert -- $Mg_{0.3}Zn_{0.7}O$ --.
Line 12, delete "...$Mg_{0.25}Zn_{075}O$ film..." and insert -- $Mg_{0.25}Zn_{0.75}O$ film --.
Line 15, delete "...$Mg_{025}Zn_{0.75}O$ film..." and insert -- $Mg_{0.25}Zn_{0.75}O$ film --.
Line 19, delete "...$Mg_{0.15}Zn_{085}O$..." and insert -- $Mg_{0.15}Zn_{0.85}O$ --.
Line 34, delete "...in the$Mg_xZn_{1-x}O$/r-A1203..." and insert -- in the $Mg_xZn_{1-x}O$/r-$Al_2O_3$ --.

Column 4,
Line 30, delete "...above $10^7$ □-cm to..." and insert -- above $10^7$ $\Omega$-cm to --.
Line 48, delete "...$Mg_{0.3}Zn_{07}O$..." and insert -- $Mg_{0.3}Zn_{0.7}O$ --.
Line 52, delete "...$Mg_{025}Zn_{075}O$..." and insert -- $Mg_{0.25}Zn_{0.75}O$ --.
Line 57, delete "...$Mg_{025}Zn_{075}O$..." and insert -- $Mg_{0.25}Zn_{0.75}O$ --.
Line 63, delete "...$Mg_{015}Zn_{085}O$..." and insert -- $Mg_{0.15}Zn_{0.85}O$ --.

Column 7,
Line 34, delete "...$Mg_{0.3}Zn_{07}O$..." and insert -- $Mg_{0.3}Zn_{0.7}O$ --.
Line 63, delete "...$Mg_{0.3}Zn_{07}O$..." and insert -- $Mg_{0.3}Zn_{0.7}O$ --.
Lines 39 and 40, delete "...$Mg_{03}Zn_{0.7}O$/r-$Al_2O_3$..." and insert -- ...$Mg_{0.3}Zn_{0.7}O$/r-$Al_2O_3$ --.
Line 50, delete "...$Mg_{03}Zn_{0.7}O$/r-$Al_2O_3$..." and insert -- ...$Mg_{0.3}Zn_{0.7}O$/r-$Al_2O_3$... --.

Column 8,
Line 6, delete "...$Mg_{015}Zn_{085}O$..." and insert -- $Mg_{0.15}Zn_{0.85}O$ --.
Line 9, delete "...$Mg_{0.15}Zn_{085}O$..." and insert -- $Mg_{0.15}Zn_{0.85}O$ --.
Line 11, delete "...$Mg_{015}Zn_{085}O$..." and insert -- $Mg_{0.15}Zn_{0.85}O$ --
Line 12, delete "...$Mg_{015}Zn_{0.85}O$..." and insert -- $Mg_{0.15}Zn_{0.85}O$ --.
Line 23, delete "...described in related to..." and insert -- described in relation to --.

UNITED STATES PATENT AND TRADEMARK OFFICE
CERTIFICATE OF CORRECTION

PATENT NO. : 6,716,479 B2
DATED : April 6, 2004
INVENTOR(S) : Yicheng Lu et al.

It is certified that error appears in the above-identified patent and that said Letters Patent is hereby corrected as shown below:

<u>Column 10,</u>
Line 7, delete "...Rayleigh waves modes..." and insert -- Rayleigh wave modes --.

Signed and Sealed this

Fifteenth Day of February, 2005

JON W. DUDAS
*Director of the United States Patent and Trademark Office*